(12) United States Patent
Chin et al.

(10) Patent No.: US 10,382,012 B2
(45) Date of Patent: Aug. 13, 2019

(54) NAVIGATION DEVICE AND TRACK SMOOTHING METHOD THEREOF

(71) Applicant: PIXART IMAGING (PENANG) SDN. BHD., Penang (MY)

(72) Inventors: Kian-Ming Chin, Penang (MY); Willie Song, Penang (MY)

(73) Assignee: PIXART IMAGING INC., Hsin-Chu County (TW)

( * ) Notice: Subject to any disclaimer, the term of this patent is extended or adjusted under 35 U.S.C. 154(b) by 234 days.

(21) Appl. No.: 14/605,007

(22) Filed: Jan. 26, 2015

(65) Prior Publication Data

US 2016/0218697 A1 Jul. 28, 2016

(51) Int. Cl.
*H03H 17/02* (2006.01)

(52) U.S. Cl.
CPC ...... *H03H 17/0248* (2013.01); *H03H 17/026* (2013.01)

(58) Field of Classification Search
CPC ........ G06F 3/0488; G06F 3/011; G06F 3/013; G06F 3/014; G06F 3/016; G06F 3/0227; G06F 3/04812; G06F 3/04817; G06F 3/0485; G06F 3/0486; G06F 1/3259; G06F 19/3406; G06F 2203/04806; G06F 2203/0331; G06F 2203/0333; G06F 17/3053; G06F 17/30867; G06F 3/03543; G06F 3/0317; G06F 3/017; G06F 3/0304; G06F 3/0383; G06F 3/0346; G06F 3/038; G06F 3/03547; G06F 3/04842; G06F 3/0325; G06F 3/04883; G06F 3/01; G06F 3/0308; G06F 3/03549; G06F 3/04845; A61B 34/20; H03H 17/0248

USPC .......................................... 708/301, 305, 445
See application file for complete search history.

(56) References Cited

U.S. PATENT DOCUMENTS

| | | | | |
|---|---|---|---|---|
| 5,404,458 A | * | 4/1995 | Zetts | G06F 3/04883 345/173 |
| RE40,410 E | * | 7/2008 | Gordon | G06F 3/0317 250/200 |
| 7,765,251 B2 | * | 7/2010 | Xu | G01D 1/02 708/445 |
| 2004/0091165 A1 | * | 5/2004 | Park | G06F 3/038 382/260 |
| 2008/0007526 A1 | * | 1/2008 | Xu | G06F 3/0317 345/163 |
| 2013/0229514 A1 | * | 9/2013 | Huang | G01C 11/02 348/140 |
| 2013/0293472 A1 | * | 11/2013 | Haung | G06F 3/03543 345/163 |

(Continued)

OTHER PUBLICATIONS

Lyons, Richard G., Understanding Digital Signal Processing, Prentice Hall, 2011, Third Edition, pp. 604-605.*

(Continued)

*Primary Examiner* — Andrew Caldwell
*Assistant Examiner* — Emily E Larocque
(74) *Attorney, Agent, or Firm* — Hauptman Ham, LLP

(57) ABSTRACT

A navigation device including a digital filter configured to smooth tracking is provided. The digital filter is configured to sequentially receive input data and output a tap sum, and calculate a quotient and a remainder by dividing an accumulation value with an average number, wherein the remainder is feedback to the tap sum for updating the accumulation value and the quotient is configured as output data.

12 Claims, 4 Drawing Sheets

(56) References Cited

U.S. PATENT DOCUMENTS

2015/0133212 A1* 5/2015 Chin ............... A63F 13/285
                                                  463/30
2016/0345847 A1* 12/2016 Gu ............... A61B 5/02427

OTHER PUBLICATIONS

Moving Average (MA), https://www.investopedia.com/terms/m/movingaverage.asp, accessed 2014 archive (Year: 2014).*

T. Kuronene, Post-Processing and Analysis of Tracked Hand Trajectories, Master Thesis, Lappeenranta University of Technology, 2014 (Year: 2014).*

* cited by examiner

| | t0 | t1 | t2 | t3 | t4 | t5 | t6 | t7 | t8 | t9 | t10 | t11 | t12 |
|---|---|---|---|---|---|---|---|---|---|---|---|---|---|
| CLK | ⎍⎍⎍⎍⎍⎍⎍⎍⎍⎍⎍⎍⎍ | | | | | | | | | | | | |
| input data | 1 | -1 | 0 | 1 | 1 | 1 | 3 | 2 | 1 | 2 | 0 | 0 | 0 |
| Tap1 | 1 | -1 | 0 | 1 | 1 | 1 | 3 | 2 | 1 | 2 | X | X | X |
| Tap2 | X | 1 | -1 | 0 | 1 | 1 | 1 | 3 | 2 | 1 | 2 | X | X |
| Tap3 | X | X | 1 | -1 | 0 | 1 | 1 | 1 | 3 | 2 | 1 | 2 | X |
| Tap4 | X | X | X | 1 | -1 | 0 | 1 | 1 | 1 | 3 | 2 | 1 | 2 |
| Tap5 | X | X | X | X | 1 | -1 | 0 | 1 | 1 | 1 | 3 | 2 | 1 |
| Tap6 | X | X | X | X | X | 1 | -1 | 0 | 1 | 1 | 1 | 3 | 2 |
| Tap7 | X | X | X | X | X | X | 1 | -1 | 0 | 1 | 1 | 1 | 3 |
| Tap8 | X | X | X | X | X | X | X | 1 | -1 | 0 | 1 | 1 | 1 |
| tap sum | 1 | 0 | 0 | 1 | 2 | 3 | 6 | 8 | 8 | 11 | 11 | 10 | 9 |
| accumulation value | 1 | 1 | 1 | 2 | 4 | 7 | 13 | 13 | 13 | 16 | 11 | 13 | 14 |
| remainder | 0(1) | 0(1) | 0(1) | 0(2) | 0(4) | 0(7) | 5 | 5 | 5 | 0 | 3 | 5 | 6 |
| quotient | 0 | 0 | 0 | 0 | 0 | 0 | 1 | 1 | 1 | 2 | 1 | 1 | 1 |

FIG. 2

NAVIGATION DEVICE AND TRACK SMOOTHING METHOD THEREOF

BACKGROUND

1. Field of the Disclosure

This disclosure generally relates to a navigation device and, more particularly, to a navigation device capable of performing track smoothing and a track smoothing method thereof.

2. Description of the Related Art

Conventionally, an optical mouse is one of the peripheral devices for interacting with the computer system having a display screen. The optical mouse generally includes a light source, an image sensor and a processing unit. The light source emits light to a working surface. The image sensor receives reflected light from the working surface and successively outputs image frames. The processing unit calculates a displacement of the optical mouse with respect to the working surface according to the image frames and sends the displacement to a computer system at a report rate for corresponding control.

However, as the image frames captured by the image sensor may contain noise which can reflect in the displacement calculated by the processing unit. Although the displacement will not be obviously affected by a position offset caused by the noise when the displacement is relatively larger than the position offset, when the displacement is very small and substantially identical to or just a little bit larger than the position offset, the track can be disturbed to have a zigzag path. Particularly in the high resolution setting, the unsmooth track becomes obvious and can be easily noticed by the operator.

SUMMARY

Accordingly, the present disclosure provides a navigation device capable of performing track smoothing and a track smoothing method thereof.

The present disclosure provides a navigation device and a track smoothing method thereof that adopt an N-tap filter to perform the averaging operation of input data.

The present disclosure further provides a navigation device and a track smoothing method thereof that may adjust a smoothing strength according to the resolution setting.

The present disclosure provides a navigation device including a digital filter for track smoothing. The digital filter includes a delay buffer, an accumulation buffer, a calculation unit and an adder. The delay buffer is configured to sequentially receive input data and output a tap sum. The accumulation buffer is configured to store an accumulation value. The calculation unit is configured to calculate a quotient and a remainder by dividing the accumulation value by an average number. The adder is configured to add the tap sum and the remainder to generate the accumulation value. The digital filter is configured to output the quotient as output data.

The present disclosure further provides a track smoothing method of a navigation device, and the navigation device includes a digital filter with an average number. The track smoothing method includes the steps of: calculating a tap sum of every tap in the digital filter; updating an accumulation value with the tap sum; calculating a quotient and a remainder by dividing the accumulation value by the average number; and outputting the quotient as output data.

The present disclosure further provides a navigation device including a digital filter for track smoothing. The digital filter is configured to calculate a quotient and a remainder by dividing an accumulation value by an average number, add next tap sum to the accumulation value to update the accumulation value when the quotient is equal to 0, and add the next tap sum and the remainder to generate a new accumulation value when the quotient is larger than 0.

In the navigation device and the track smoothing method according to the present disclosure, the digital filter is, for example, an N-tap filter, wherein N is a delay number and an average number. In one embodiment, the tap sum is a sum of data of every tap in the digital filter. In one embodiment, the digital filter is adjustable to an 8-tap filter, a 16-tap filter, a 32-tap filter, a 64-tap filter and so on according to a required average strength.

BRIEF DESCRIPTION OF THE DRAWINGS

Other objects, advantages, and novel features of the present disclosure will become more apparent from the following detailed description when taken in conjunction with the accompanying drawings.

FIG. 2 is an operational schematic diagram of a navigation device according to one embodiment of the present disclosure.

DETAILED DESCRIPTION OF THE EMBODIMENT

It should be noted that, wherever possible, the same reference numbers will be used throughout the drawings to refer to the same or like parts.

Figure 1:
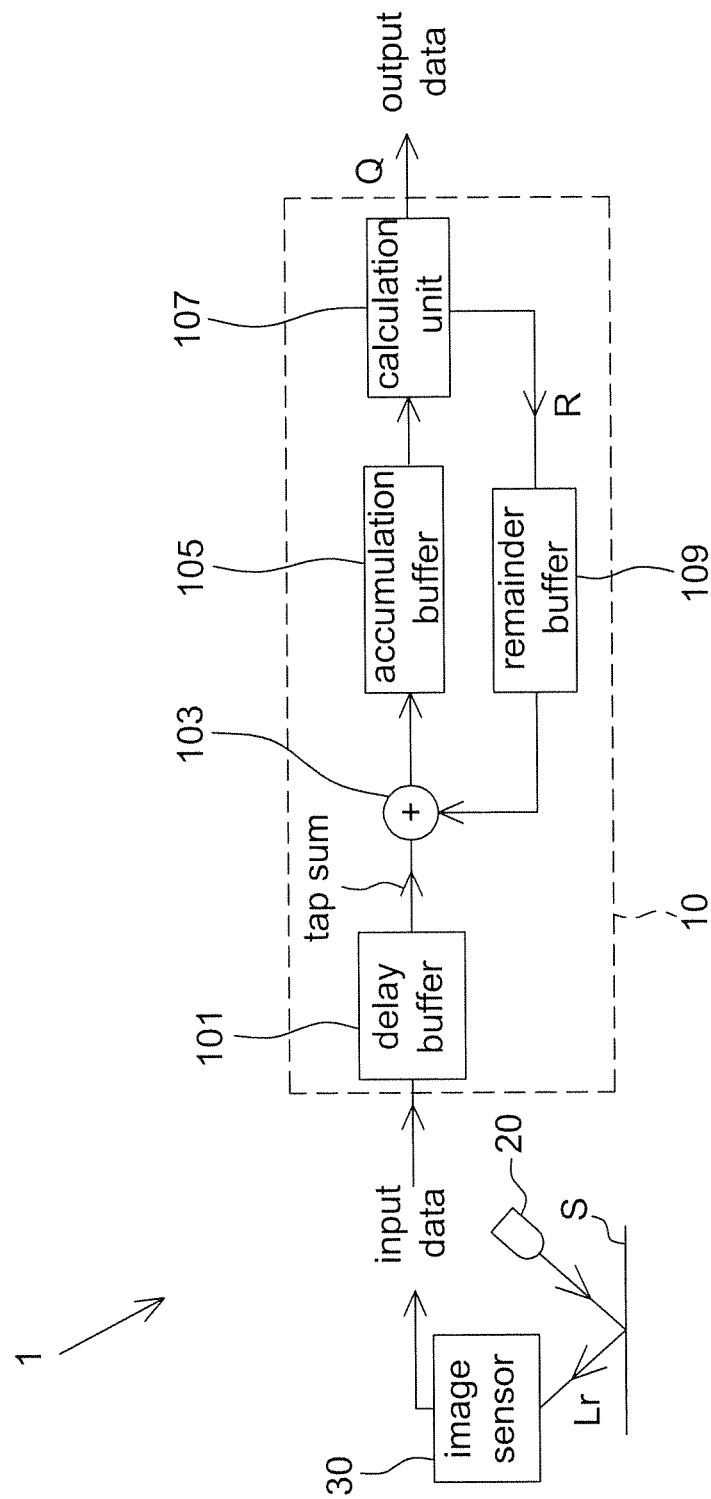
FIG. 1 is a schematic block diagram of a navigation device according to one embodiment of the present disclosure.

Referring to FIG. 1, it is a schematic block diagram of a navigation device according to one embodiment of the present disclosure. The navigation device 1 of the present disclosure is, for example, operated on a working surface 5, and configured to detect the motion with respect to the working surface S and output smoothed displacement. It should be mentioned that although in FIG. 1 the navigation device 1 is shown to be operated on the working surface S, the present disclosure is not limited thereto. The navigation device 1 is also adaptable to handheld navigation devices such as a remote device, a pointing device or the like without particular limitations.

The navigation device 1 includes a light source 20, an image sensor 30 and a digital filter 10, wherein the digital filter 10 is, for example, included in a processor. In some embodiments, the light source 20, the image sensor 30 and the digital filter 10 are all included in an image sensor package such as an image sensing chip, and the image sensor package is configured to output a smoothed track. In other embodiments, the light source 20 and the image sensor 30 are included in an image sensor package but the digital filter 10 is in an external processor, e.g. a central processing unit (CPU), a microcontroller (MCU) or the like outside of the image sensor package. It should be mentioned that when the navigation device 1 is adapted to a handheld navigation device, the light source 20 may not be implemented.

The light source 20 is, for example, a coherent light source, a partially coherent light source or a non-coherent light source such as a light emitting diode or a laser diode, but not limited thereto. The light source 20 is configured to emit light of an identifiable spectrum to illuminate the working surface S.

The image sensor 30 includes, for example, a CCD image sensing element, a CMOS image sensing element or other optoelectronic elements capable of detecting light signals and output electrical signals. The image sensor 30 is configured to receive reflected light from the working surface S to generate digital image frames (e.g. including an analog-to-digital converter therein for digitizing), and calculate displacement according to the digital image frames, e.g. calculating according to the correlation between image frames. The displacement data outputted by the image sensor 30 is not smoothed. In the present disclosure, the digital filter 10 receives the displacement data outputted from the image sensor 30 and performs the smoothing process so as to output smoothed displacement data.

It should be mentioned that although FIG. 1 shows that the image sensor 30 and the light source 20 are arranged symmetrical to a normal line of the working surface S for receiving a main reflection light beam Lr from the working surface S, also referred as a bright field arrangement, but the present disclosure is not limited thereto. In other embodiments, the image sensor 30 and the light source 20 may form a dark field arrangement, i.e. the image sensor 30 and the light source 20 not symmetrical to the normal line of the working surface S, and in this case the image sensor 30 is configured to receive scattered light from the working surface S.

Referring to FIGS. 1 and 2 together, FIG. 2 is an operational schematic diagram of a navigation device according to one embodiment of the present disclosure. The digital filter 10 includes a delay buffer 101, an adder 103, an accumulation buffer 105, a calculation unit 107 and a remainder buffer 109, wherein every element in the digital filter 10 may be implemented by software and/or firmware without particular limitation. The digital filter 10 is configured to receive input data from the image sensor 30 and generate output data after the smoothing process. For example, FIG. 2 shows a data series of the input data [1 −1 0 1 1 1 3 2 1 2 0 0 0] which are sequentially inputted into the digital filter 10 at times $t_0$ to $t_{12}$, wherein each data of the data series is, for example, displacement data and the negative sign indicates an opposite direction. It should be mentioned that a movement of the navigation device 1 on the working surface S may be two-dimensional displacement, and FIG. 2 shows only one-dimensional displacement data (e.g. X-axis), and the operation of another dimension (e.g. Y-axis) is identical to that of FIG. 2 and thus details thereof are not repeated herein. More specifically, after each dimension of the two-dimensional displacement is respectively obtained by the digital filter 10 (e.g. according to FIGS. 1 and 2), the processor including the digital filter 10 then calculates a sum of vector thereof using vector arithmetic and outputs the movement corresponding to the sum of vector according to the resolution setting.

The delay buffer 101 has a delay number and is configured to sequentially receive input data and output a tap sum. In one embodiment, when a number of input data is larger than the delay number, the most first input data is firstly removed from the delay buffer 101 so as to form a first-in first-out operation. The digital filter 10 is configured to calculate a quotient and a remainder by dividing an accumulation value by an average number. In one embodiment, when the quotient is smaller than 1 (e.g. equal to 0), the digital filter 10 adds next tap sum to the accumulation value so as to update the accumulation value; whereas, when the quotient is larger than 0, the digital filter 10 adds the next tap sum and the remainder to be served as a new accumulation value. Next, the digital filter 10 divides the updated accumulation value or the new accumulation value by the average number. The smoothing of the input data is performed by repeatedly calculating in this way. In other embodiments, no matter whether the quotient is larger than or equal to 0, the digital filter 10 adds the next tap sum and the remainder to be served as a new accumulation value (illustrated with examples below). Preferably the delay number is equal to the average number.

For example, the digital filter 10 is an N-tap filter (e.g. N=8 shown herein, but not limited thereto), i.e. the average number and the delay number are both equal to N.

In one embodiment, the tap sum is a sum of data of every tap (e.g. Tap1 to Tap8) in the delay buffer 101. Referring to FIG. 2, for example at time $t_0$, the tap sum is a sum of single data in Tap1 as well as data in Tap2 to Tap8 (e.g. a symbol "X" shown herein due to no data being received, and X=0 actually). For example at time $t_1$, the tap sum is a sum of two data in Tap1 and Tap2 as well as data in Tap3 to Tap8. Similarly, the tap sum at times $t_2$ to $t_{12}$ is obtainable in a similar way.

The accumulation buffer 105 is configured to store an accumulation value, which is updated at every clock cycle (e.g. $t_0$ to $t_{12}$). The calculation unit 107 is implemented, for example, by a divider which is configured to calculate a quotient and a remainder by dividing the accumulation value by the average number N, wherein the digital filter 10 outputs the quotient as the output data (e.g. smoothed displacement data), and the remainder may be stored in the remainder buffer 109. The adder 103 is configured to add the tap sum and the remainder so as to generate the accumulation value.

In the present disclosure, the accumulation value is obtainable according to at least two ways as illustrated below with examples.

In one embodiment, a method of updating the accumulation value is determined according to the quotient. For example, when the quotient is smaller than 1 (e.g. equal to 0), the calculation unit 107 sets the remainder to 0, and a next tap sum is directly added to the accumulation value already stored in the accumulation buffer 105 so as to update the accumulation value; whereas, when the quotient is larger than 0, the adder 103 adds the next tap sum and the remainder to be served as a new accumulation value, which is then stored in the accumulation buffer 105.

For example referring to FIG. 2, at time $t_0$, as the data of Tap1 is "1" and the data of Tap2 to Tap8 is "0", the tap sum is calculated as "1". It is assumed that an initial accumulation value is "0", and the accumulation value is equal to "1" which is calculated by adding the tap sum "1" to the initial accumulation value "0". Next, the calculation unit 107 divides the accumulation value "1" by the average number N so as to obtain a quotient equal to "0" and a remainder equal to "1". Meanwhile, as the quotient is equal to "0", the calculation unit 107 either sets the remainder to "0" or does not store the remainder to the remainder buffer 109. For example, the digital filter 10 resets the remainder stored in the remainder buffer 109 to "0" when the quotient is smaller than 1. Meanwhile, the digital filter 10 outputs zero displacement.

At time $t_1$, as the data of Tap2 is "1", the data of Tap1 is "−1" and the data of Tap3 to Tap8 is "0", the tap sum is calculated as "0". The accumulation value is still equal to "1" which is calculated by adding a next (i.e. time $t_1$) tap sum "0" to the accumulation value "1" already stored in the accumulation buffer 105. Next, the calculation unit 107 performs the division operation so as to obtain another quotient equal to "0" and another remainder equal to "1". Similarly, as the quotient is equal to "0", the calculation unit 107 sets the remainder to "0" and the digital filter 10 outputs zero displacement.

In some embodiments, as the remainder is set to 0, the accumulation value may be calculated by adding the next tap sum, the remainder and the accumulation value, and the calculation result is not changed. In other embodiments, the calculation unit 107 may not set the remainder to 0 as long as the remainder is ignored in calculating the accumulation value, e.g. disable the adder 103 or not reading the accumulation buffer 109.

Similarly, the calculation of the accumulation value at times $t_2$ to $t_6$ is obtainable in a similar way.

At time $t_7$, as the data from Tap8 to Tap1 is [1 −1 0 1 1 1 3 2], the tap sum is calculated as "8" (=1+(−1)+0+1+1+1+3+2). Meanwhile as the calculation unit 107 obtains a quotient equal to "1" (larger than 0) and a remainder equal to "5" at time $t_6$, the accumulation value is equal to "13" which is calculated by adding the tap sum "8" and a previous (i.e. at time $t_6$) remainder "5". Next, the calculation unit 107 performs the division operation so as to obtain another quotient equal to "1" and another remainder equal to "5". More specifically, as the quotient is not equal to "0" at time $t_6$, the remainder buffer 109 is not reset.

Similarly, the calculation of the accumulation value at times $t_8$ to $t_{12}$ is obtainable in a similar way.

In this embodiment, the digital filter 10 receives one input data at each clock time $t_1$ to $t_{12}$ and obtains a quotient and a remainder after the averaging operation (i.e. dividing the accumulation value by the average value). When the quotient is larger than 0, the remainder is stored in the remainder buffer 109 for updating. When the quotient is smaller than 1 (e.g. equal to 0), the remainder may be stored in the remainder buffer 109 or the storage of the remainder buffer 109 may be reset to 0. More specifically, in this embodiment, when the quotient is smaller than 1, the digital filter 10 outputs zero displacement and resets the storage in the remainder buffer 109 to zero or ignores the remainder (i.e. the remainder stored or not stored in the remained buffer 109); whereas, when the quotient is larger than 0, the digital filter 10 outputs nonzero smoothed displacement and the obtained remainder is stored in the remainder buffer 109.

In another embodiment, the accumulation value is always a sum of the tap sum and the remainder. That is, the calculation unit 107 updates the remainder stored in the remainder buffer 109 at each clock cycle (e.g. $t_0$ to $t_{12}$).

Referring to FIG. 2, for example at time to, as the data of Tap1 is "1" and the data of other taps Tap2 to Tap8 is "0", the tap sum is calculated as "1". It is assumed that an initial remainder is "0", and the accumulation value is equal to "1" which is calculated by adding the tap sum "1" and the initial remainder "0". Next, the calculation unit 107 divides the accumulation value "1" by the average number N so as to obtain a quotient equal to "0" and a remainder equal to "1". Meanwhile, the digital filter 10 outputs zero displacement and the remainder "1" is stored in the remainder buffer 109.

At time $t_1$, as the data of Tap2 is "1", the data of Tap1 is "−1" and the data of other taps Tap3 to Tap8 is "0", the tap sum is calculated as "0". The accumulation value is still equal to "1" which is calculated by adding a next (i.e. time $t_1$) tap sum "0" and the remainder "1" already stored in the remainder buffer 109. Next, the calculation unit 107 also performs the division operation so as to obtain another quotient equal to "0" and another remainder equal to "1". Accordingly, the digital filter 10 outputs zero displacement and the remainder "1" is used to update the remainder in the reminder buffer 109.

Similarly, the calculation of the accumulation value at times $t_2$ to $t_{12}$ is obtainable in a similar way.

In the present disclosure, at each time $t_0$ to $t_{12}$ the digital filter 10 outputs the quotient Q obtained by the calculation unit 107 to be served as the smoothed displacement data. In addition, it is known from FIG. 2 that a delay time exists between a time (e.g. $t_0$) that the navigation device 1 starts to move and a time (e.g. $t_6$) that the digital filter 10 starts to output nonzero displacement, e.g. 6 clock cycles being delayed in FIG. 2, wherein an actual delay time is determined according to the input data and not limited to that shown in FIG. 2. Accordingly, in order to allow the digital filter 10 not to continuously output nonzero displacement when the navigation device 1 stops moving with respect to the working surface S, e.g. the quotient Q not zero at times $t_9$ to $t_{12}$ in FIG. 2 when successive input data becomes zero, in some embodiments the digital filter 10 directly sets the output data to 0 when a predetermined number of successive input data is 0, wherein the predetermined number is preferably smaller than the average number N, but not limited thereto. In some embodiments, when the navigation device 1 operates at a high frame rate and the average number N is not high, said delay time may not influence the operation such that the digital filter 10 may continuously output the output data (i.e. quotient Q) obtained by the calculation unit 107 without setting the output data to 0.

In some embodiments, the average number N is positively correlated with a resolution of the navigation device 1. When the resolution is higher, the influence on the navigation device 1 from the noise or the working surface S becomes more obvious, and thus a higher smoothing strength (i.e. higher N) is selected so as to increase the track smooth. For example as shown in Table 1 below, in the present disclosure the average number N may be adjusted to 8, 16, 32 or 64 corresponding to different resolutions. When the resolution of the navigation device 1 is changed, the average number N is correspondingly adjusted. In some embodiments, when the average number N is low (e.g. N=8 or 16), said delay time is shorter and the digital filter 10 may be arranged to continuously output the output data obtained by the calculation unit 107 without setting the output data to 0. In other embodiments, when the average number N is high (e.g. N=32 or 64), said delay time is longer and the digital filter 10 may be arranged to set the output data to 0 when a predetermined number of successive input data is 0. It is appreciated that when the average number is adjusted, the delay number is adjusted as well.

TABLE 1

| Average number (N) | Resolution range (DPI) |
|---|---|
| 8 | 50-2,000 |
| 16 | 2,050-3,600 |
| 32 | 3,650-5,000 |
| 64 | 5,050-8,200 |

Figure 3:
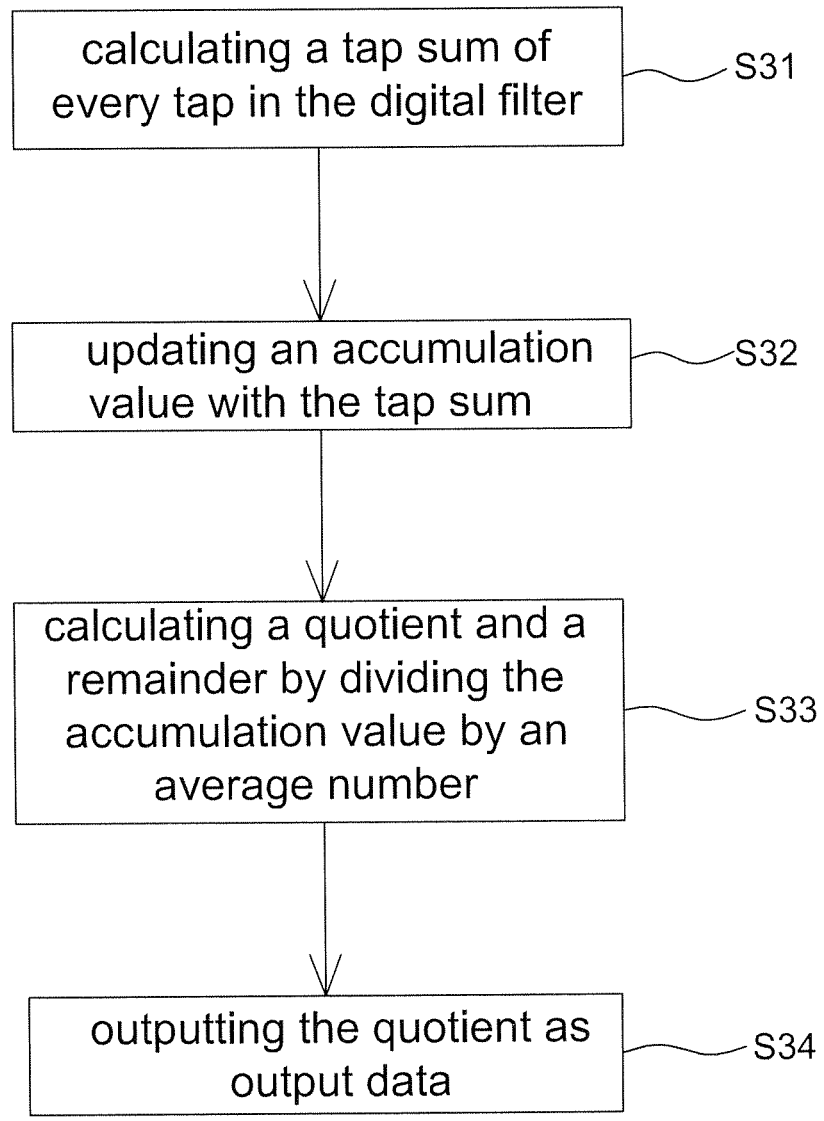
FIGS. 3-4 are flow charts of the track smoothing method of a navigation device according to some embodiments of the present disclosure.
Figure 4:
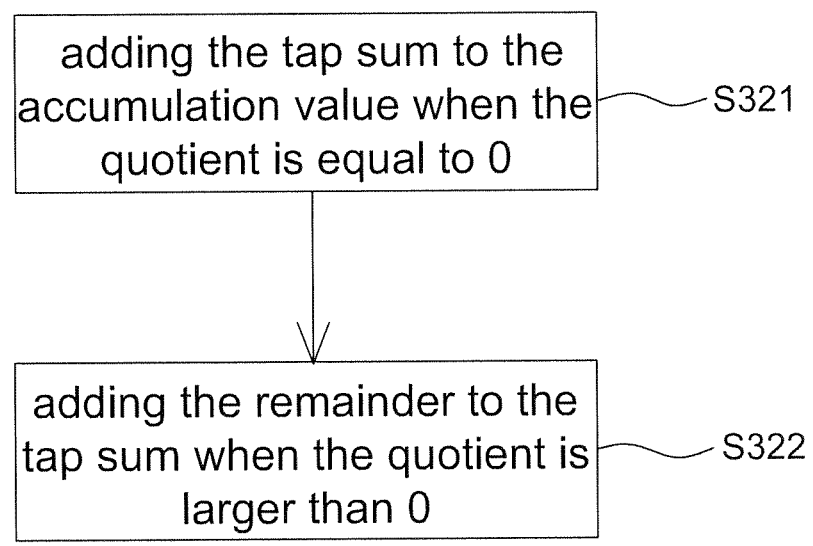

Referring to FIGS. 3 and 4, they are flow charts of the track smoothing method of a navigation device according to some embodiments of the present disclosure. The track smoothing method includes the steps of: calculating a tap sum of every tap in a digital filter (Step S31); updating an accumulation value with the tap sum (Step S32); calculating a quotient and a remainder by dividing the accumulation value by an average number (Step S33); and outputting the quotient to be served as output data (Step S34).

Step S31: As shown in FIG. 2, the delay buffer 10 is configured to output a tap sum of every tap therein (e.g. Tap1 to Tap8), and a tap number is determined according to the required smoothing strength.

Step S32: As mentioned above, an accumulation value is obtainable according to at least two ways. In one embodiment, when a quotient Q is smaller than 1 (e.g. equal to 0), the tap sum is directly added to the accumulation value stored in the accumulation buffer 105 (Step S321 shown in FIG. 4) for updating, and a remainder R may be set to 0 or ignored; whereas, when the quotient Q is larger than 0, the adder 103 adds the remainder R to the tap sum (Step S322 shown in FIG. 4) to be served as a new accumulation value which is then stored in the accumulation buffer 105. In other embodiments, the accumulation value is always a sum of the tap sum and the remainder R.

Step S33: Next, the calculation unit 107 divides the accumulation value by the average number N so as to obtain the quotient Q and the remainder R.

Step S34: The navigation device 10 outputs the quotient Q to be served as output data (i.e. smoothed displacement data). The remainder R may be stored in the remainder buffer 109, ignored or set to 0 according to different applications.

The track smoothing method of this embodiment may be referred to FIGS. 1 to 2 and corresponding descriptions, and thus details thereof are not repeated herein. In addition, in order to increase the operation accuracy, the track smoothing method of this embodiment may also include the step: setting the output data to 0 when a predetermined number of successive input data is 0.

It should be mentioned that values in the above embodiment such as the average number, delay number, resolution, input data, output data, tap sum, accumulation value, remainder and quotient are only intended to illustrate but not to limit the present disclosure. In addition, although the values shown in FIG. 2 are all integers, the present disclosure is not limited thereto, and the values in FIG. 2 may also be decimals.

As mentioned above, the track outputted by the conventional optical mouse may not be smooth due to the noise and operating conditions. Therefore, the present disclosure further provides a navigation device (FIG. 1) and a track smoothing method thereof (FIGS. 3-4) that may smooth the track of a plurality of input data and the smoothing strength is adjustable according to the device resolution thereby increasing the adaptability thereof.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A navigation device, having a resolution indicated by dot per inch (DPI), and configured to detect motion and output smoothed displacement with respect to a working surface upon which the navigation device is operated, the navigation device comprising:
   an image sensor configured to sense reflection light beams from the working surface and output input data which is not smoothed; and
   a processor comprising a digital filter which is coupled to the image sensor to receive the input data, the digital filter comprising:
   a delay buffer comprising multiple taps configured to sequentially receive, at every clock cycle, a data series of the input data to be stored in the multiple taps in a first-in first-out operation from the image sensor, and output a tap sum, which is a sum of each data of the data series stored in the multiple taps;
   an accumulation buffer configured to store, corresponding to the every clock cycle, an accumulation value;
   a divider coupled to the accumulation buffer to receive the accumulation value, and configured to calculate, corresponding to the every clock cycle, a quotient and a remainder by dividing the accumulation value by an average number which is associated with a smoothing strength of the navigation device;
   a remainder buffer coupled to the divider to receive, corresponding to the every clock cycle, the remainder, wherein the divider sets a calculated non-zero remainder to 0 when the quotient is 0, while the remainder is stored in the remainder buffer only when the quotient is larger than 0; and
   an adder coupled to the delay buffer, the remainder buffer and the accumulation buffer, and configured to add, corresponding to the every clock cycle, the tap sum and the remainder stored in the remainder buffer to generate the accumulation value when the quotient is larger than 0;
   wherein the digital filter is configured to output, corresponding to the every clock cycle, the quotient as the smoothed displacement to control a cursor or a pointer on a display, and
   when the resolution of the navigation device is changed from a first resolution to a second resolution higher than the first resolution, the average number is adjusted from a first number to a second number higher than the first number to increase the smoothing strength thereby reducing influence on the navigation device from noise or the working surface and increasing track smooth.

2. The navigation device as claimed in claim 1, wherein the smoothed displacement is set to 0 when a predetermined number of successive input data is 0.

3. The navigation device as claimed in claim 2, wherein the predetermined number is smaller than the average number.

4. The navigation device as claimed in claim 1, wherein when the quotient is equal to 0, next tap sum is added to the accumulation value to update the accumulation value.

5. The navigation device as claimed in claim 1, wherein in the first-in first-out operation, one data in the data series firstly inputted into a first tap of the multiple taps is firstly removed from a last tap of the multiple taps.

6. A track smoothing method of a navigation device, the navigation device detecting motion and outputting smoothed displacement with respect to a working surface upon which the navigation device is operated, the navigation device having a resolution indicated by dot per inch (DPI), and comprising an image sensor sensing reflection light beams from the working surface to output input data and a processor which comprises a digital filter with an average number which is associated with a smoothing strength of the navigation device, and coupled to the image sensor to receive the input data, the track smoothing method comprising:
   receiving, at every clock cycle, a data series of the input data, which is not smoothed, from the image sensor to be sequentially stored in multiple taps of the digital filter in a first-in first-out operation;
   calculating a tap sum of each data of the data series of the input data stored in every tap in the digital filter;

updating, corresponding to the every clock cycle, an accumulation value with the tap sum;

calculating, corresponding to the every clock cycle, a quotient and a remainder by dividing the accumulation value by the average number;

setting a calculated non-zero remainder to 0 when the quotient is equal to 0, while storing the remainder in a remainder buffer only when the quotient is larger than 0; and outputting, corresponding to the every clock cycle, the quotient as the smoothed displacement to control a cursor or a pointer on a display, wherein when the resolution of the navigation device is changed from a first resolution to a second resolution higher than the first resolution, the average number is adjusted from a first number to a second number higher than the first number to increase the smoothing strength thereby reducing influence on the navigation device from noise or the working surface and increasing track smooth.

7. The track smoothing method as claimed in claim 6, wherein the updating further comprises:

adding the tap sum to the accumulation value when the quotient is equal to 0; and adding the remainder stored in the remainder buffer to the tap sum when the quotient is larger than 0.

8. The track smoothing method as claimed in claim 6, further comprising:

setting the output data to 0 when a predetermined number of successive input data is 0.

9. The track smoothing method as claimed in claim 8, wherein the predetermined number is smaller than the average number.

10. A navigation device, having a resolution indicated by dot per inch (DPI), and configured to detect motion and output smoothed displacement with respect to a working surface upon which the navigation device is operated, the navigation device comprising:

an image sensor configured to receive reflection light beams from the working surface and output input data which is not smoothed; and a processor comprising a digital filter which is coupled to the image sensor to receive, at every clock cycle, a data series of the input data, the digital filter comprising:

a divider configured to calculate, corresponding to the every clock cycle, a quotient and a remainder by dividing an accumulation value by an average number which is associated with a smoothing strength of the navigation device, wherein the divider sets a calculated non-zero remainder to 0 when the quotient is 0, while the remainder is stored in a remainder buffer only when the quotient is larger than 0; and an adder configured to add, corresponding to the every clock cycle, next tap sum to the accumulation value stored in an accumulation buffer to update the accumulation value when the quotient is equal to 0, and add, corresponding to the every clock cycle, the next tap sum and the remainder stored in the remainder buffer to generate a new accumulation value when the quotient is larger than 0, wherein the next tap sum is a sum of each data of the data series of the input data stored in every of multiple taps in the digital filter received from the image sensor, and the data series of the input data are sequentially stored in the multiple taps in a first-in first-out operation, and when the resolution of the navigation device is changed from a first resolution to a second resolution higher than the first resolution, the average number is adjusted from a first number to a second number higher than the first number to increase the smoothing strength thereby reducing influence on the navigation device from noise or the working surface and increasing track smooth, wherein the digital filter is configured to output, corresponding to the every clock cycle, the quotient as the smoothed displacement to control a cursor or a pointer on a display.

11. The navigation device as claimed in claim 10, wherein the digital filter is further configured to set the output data to 0 when a predetermined number of successive input data is 0.

12. The navigation device as claimed in claim 11, wherein the predetermined number is smaller than the average number.

* * * * *